(12) United States Patent
Namba et al.

(10) Patent No.: US 7,265,814 B2
(45) Date of Patent: Sep. 4, 2007

(54) MIRROR HOLDING METHOD AND OPTICAL APPARATUS

(75) Inventors: Hisashi Namba, Tochigi (JP); Eiji Sakamoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 100 days.

(21) Appl. No.: 10/845,008

(22) Filed: May 12, 2004

(65) Prior Publication Data

US 2004/0228018 A1 Nov. 18, 2004

(30) Foreign Application Priority Data

May 14, 2003 (JP) ............................. 2003-135931

(51) Int. Cl.
*G03B 27/70* (2006.01)
*G02B 5/08* (2006.01)

(52) U.S. Cl. ........................................ 355/66; 359/846

(58) Field of Classification Search ................. 355/66, 355/67, 18, 53, 77; 250/492.2; 359/846
See application file for complete search history.

(56) References Cited

U.S. PATENT DOCUMENTS

2003/0147161 A1* 8/2003 Shiraishi ..................... 359/846
2004/0084632 A1* 5/2004 Komatsuda .............. 250/492.2

FOREIGN PATENT DOCUMENTS

JP 9-213618 8/1997
JP A 2003-172857 6/2003

OTHER PUBLICATIONS

English Abstract for Japanese Patent Laid Open Application No. 2003-172857.

* cited by examiner

*Primary Examiner*—Peter B. Kim
(74) *Attorney, Agent, or Firm*—Morgan & Finnegan, LLP

(57) ABSTRACT

This invention relates to a mirror holding method, wherein a symmetry axis of an illuminating area corresponds with that of a mirror holder, and a center of the illuminating area in a mirror differs from a centroid of the mirror.

8 Claims, 8 Drawing Sheets

MIRROR HOLDING METHOD AND OPTICAL APPARATUS

This application claims priority benefits based on Japanese Patent Application No. 2003-135931, filed on May 14, 2003, which is hereby incorporated by reference herein in its entirety as if fully set forth herein.

BACKGROUND OF THE INVENTION

The present invention relates generally to an optical apparatus with a mirror and a mirror holder, and more particularly to an exposure apparatus as an optical apparatus used for fabricating semiconductor and the like.

A semiconductor exposure apparatus transfers circuit patterns from an original form (or reticle) onto a substrate (or a silicon wafer). A projecting optical system uses a light source of ultra-high pressure mercury lamp (i-lay), KrF excimer laser, or ArF excimer laser, and a lens for imaging a reticle's pattern onto a wafer in these light's wavelength.

To fabricate high integrated circuits, a projecting lens requires high resolution. Thus, a lens for a semiconductor exposure apparatus is fabricated with lower aberration.

However, in recent teachings of the fine development of a semiconductor circuit, the exposure light's wavelength, in an exposure apparatus, has been shortened. Hence, Extreme Ultraviolet Radiation (hereinafter EUV light) will be used as exposure light (Japanese Patent Application No. 2003-172857).

For EUV light, a mirror as an optical system is used because a lens cannot be used as an optical system since it does not transmit EUV light. As a result, a developing mirror in EUV light does not have reflection rates greater than 70%. Thus, the mirror's temperature increases because it absorbs about 30% of the EUV light and changes it into heat. The increasing temperature causes bad aberration due to thermal expansion and extreme deformation of the mirror. Therefore, a mirror cooling apparatus is arranged to inhibit thermal distortion and the bad aberration. However, although it is able to inhibit rising temperature, it is not able to absolutely prohibit the rising temperature in the whole mirror from deforming the mirror. When deformation of the mirror results from simple expansion or contraction, correction such as to a mirror's position can decrease the bad aberration because the main change is only to the curvature. However, the mirror cannot have simple expansion or contraction because the symmetry axis of an illuminating area on the mirror, in this kind of conventional mirror holder, differs extremely from that of the mirror holder.

Accordingly, it is an exemplary object of the present invention to provide a mirror holding method for inhibiting asymmetry surface deformation which extremely degrades optical performance, illumination point transference, and defocus value; and for changing deformation value of the mirror into simple deformation, by eliminating thermal stress, to inhibit the above bad aberration.

BRIEF SUMMARY OF THE INVENTION

A mirror holding method according to the present invention, for example, wherein a symmetry axis of an illuminating area substantially corresponds with that of a mirror holder in an optical system, and a center of the illuminating area in a mirror differs from a centroid of the mirror. For example, even if the center in the illuminating area of the mirror differs from the centroid in the mirror, stress distribution that occurs from heat generated by exposure light in the mirror is symmetrical on both sides of a symmetry axis because a symmetry axis in an illuminating area (substantially) corresponds with that of the mirror holder. Thus, it is possible to change deformation of the mirror's surface into symmetric.

Here, the center of the illuminating area on the mirror means a center point between a long axis (or a major axis) and a brachyaxis (or a minor axis) (where a circle is considered one specific form of an ellipse where the major axis is as long as the minor axis) when, for example, an illuminating area is radii-shape, ellipse-shape, intermediate shape between a radii and an ellipse, and/or circle-shape, as shown in FIGS. 3A, 4A and 5A. The center of the mirror means a centroid point CS of a projected area PA of an optical surface OS of the mirror 10 when the optical surface OS is projected onto a surface S having a normal that is an optical axis as shown in FIG. 2.

A mirror holding method, wherein a center of the illuminating area may (substantially) corresponds with that of the mirror holder. According to the mirror holding method, it is able to prevent large displacement, which results from thermal expansion in a center position of an illuminating area on the mirror because light is illuminated to a center of the mirror holder.

The center of the mirror holder is a reference point for arranging the mirror holder at equivalent angles around the center as shown in FIG. 3C.

A mirror holding method, wherein a centroid of the illuminating area may (substantially) correspond with that of the mirror holder. According to the mirror holding method, it is able to prevent large displacement, which results from thermal expansion in a centroid position of an illuminating area on the mirror because light is illuminated to a center of the mirror holder.

The center of the illuminating area means a center point of an area determined by projecting an illuminating area onto a plane that has a normal as an optical axis.

Another mirror holding method according to the present invention, wherein the mirror may reflect Extreme Ultraviolet Radiation (EUV) light. When EUV light is illuminated to the mirror, even if the mirror has a large rate of EUV light absorption, the mirror holding method may change the surface deformation in the mirror into symmetric, and reduce deformation which deteriorates optical performance.

An exposure apparatus according to the present invention may include the above mirror holding method. Accordingly, the exposure apparatus may finely expose by using the mirror holding method in the exposure apparatus.

A device fabricating method according to the present invention is comprised of the steps of exposing an object by an exposure apparatus, which includes the above mirror holding method, and developing the exposed object.

DETAILED DESCRIPTION OF THE PREFERRED EMBODIMENTS

Figure 1:
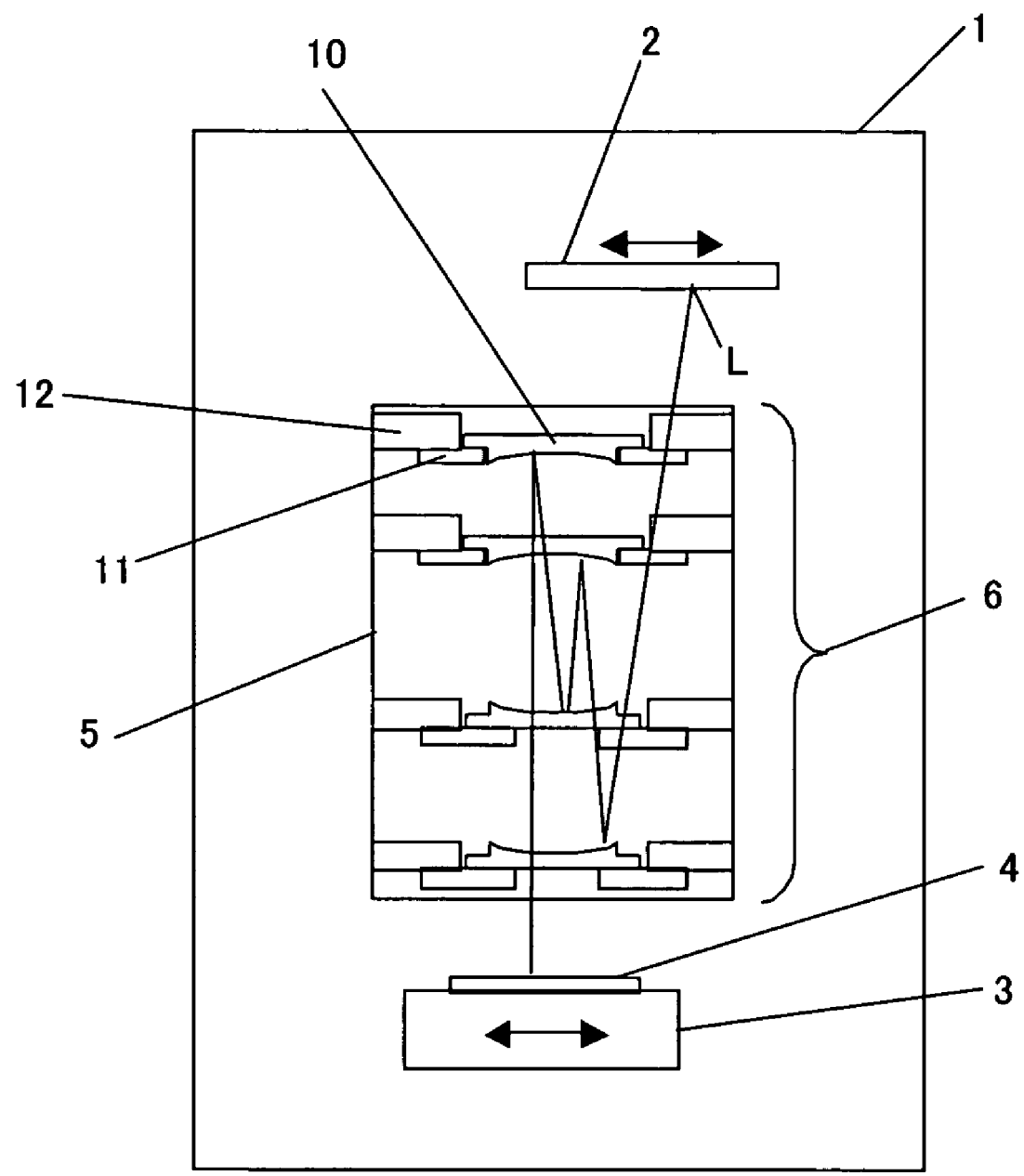
FIG. 1 is a schematic structure view of an exposure apparatus according to the present invention.

FIG. 1 is a schematic structure view of an exposure apparatus with a mirror holding method of a first embodiment according to the present invention. The exposure apparatus, by using EUV light with a wavelength of about 13 nm to illuminate a mask, uniformly illuminates a reflecting type mask and projects a pattern of the mask onto a wafer.

In FIG. 1, 1 is a chamber that divides an exposure atmosphere in air, and is vacuum-pumped by a pump (not shown). An exposure light L, reflected by a reticle 2, passes a projecting optical system 6 and is illuminated onto a wafer 4. A pattern on the reticle 2 is transferred onto a wafer 4 that is arranged on a wafer stage 3.

Figure 2:
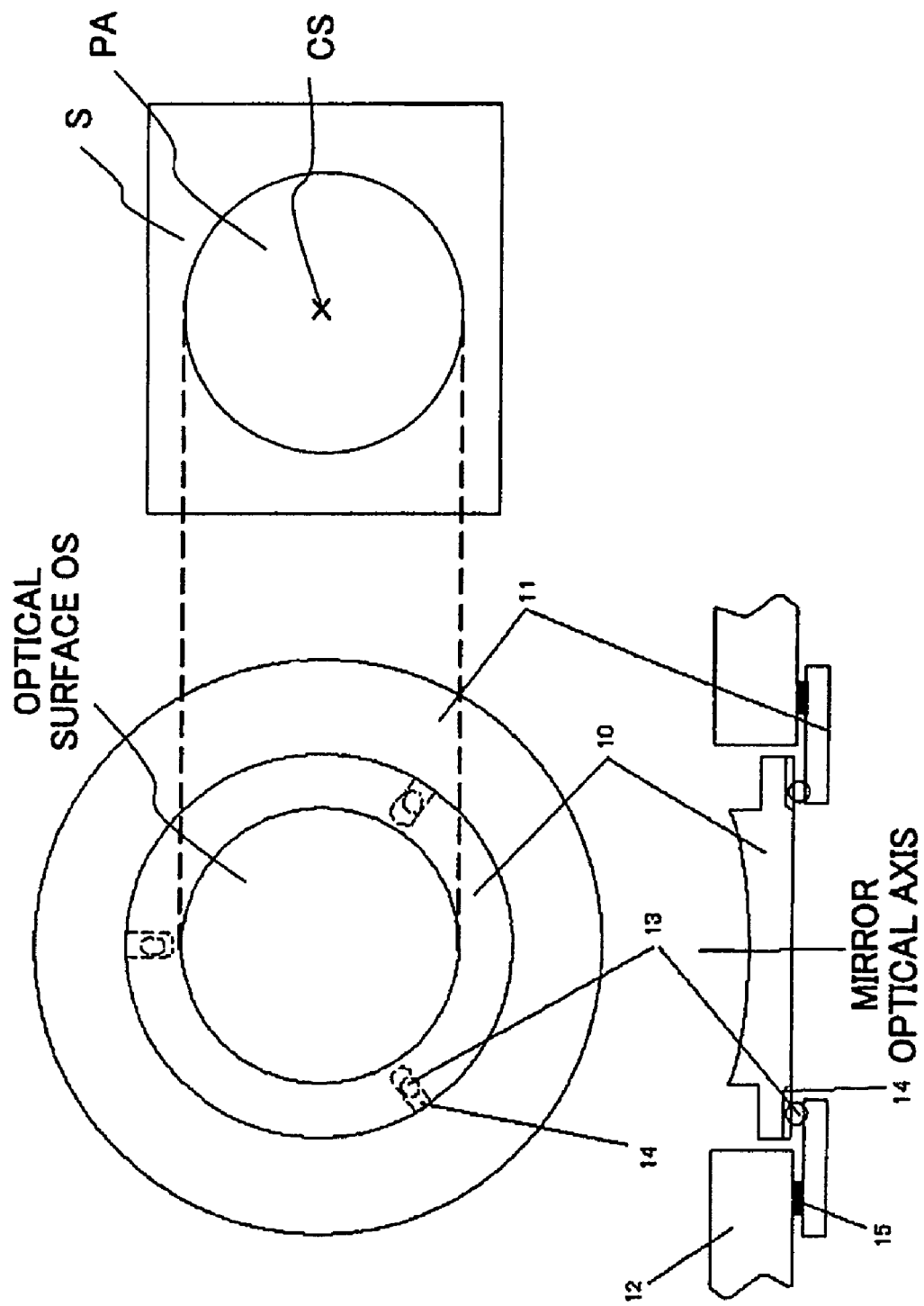
FIG. 2 is a schematic structure view of a mirror and a mirror holder according to the present invention.

FIG. 2 is a view of a mirror and a mirror holder according to the present invention. A mirror holding member 12, which holds a mirror-supporting member 11, is fixed on a wall of a bodytube 5. A position controller 15, arranged between the mirror-supporting member 11 and the mirror holding member 12, controls the position or tilt of the mirror-supporting member 11. It controls the position or tilt of a mirror 10 by controlling the position or tilt of the mirror-supporting member 11. The mirror 10 is held by the mirror-supporting member 11 via a sphere 13. The mirror 10 includes a V-shaped groove 14, which holds the sphere 13. The mirror-supporting member 11 includes a cone hole, which also holds the sphere 13. The sphere 13 is fixed by the supporting member 11. The diameter of mirror 10 is about 60 mm to 500 mm.

When an optical system includes a lens, a substantial amount of exposure light is illuminated on the center. As shown in Japanese Patent application No. 09-213618, in an exposure apparatus with a mirror projection, a substantial amount of exposure light is illuminated onto the center. However, an optical system which includes a mirror and illuminates exposure light on only one side of the mirror deteriorates the distortion symmetry in the mirror when a holding point is arranged as a symmetry axis 22 in the illuminating area 20 of the exposure light does not correspond with a symmetry axis 21 in a holding point of the mirror 10 shown in FIG. 3B. As shown in FIG. 3B, an illuminating value on the right side of symmetry axis 21 is larger than that on the left side. Thus, thermal expansion value on the right side is larger than that on the left. Therefore, the curvature of the mirror 10 on the right side of the symmetry axis 21 differs from that on the left. An EUV exposure apparatus may have an exposure light illuminating area that includes radii-shape, ellipse-shape, intermediate shape between a radii and an ellipse, or circle-shape. When these shaped sizes are measured at a long axis and a brachyaxis (a circle's long axis equals its brachyaxis, but a circle may include an ellipse), the long axis is about 100 mm to 300 mm and the brachyaxis is about 20 mm to 300 mm.

Figure 3A:
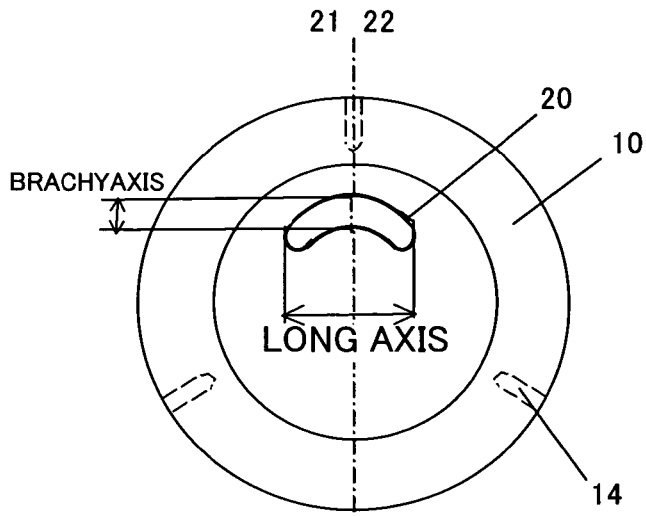
FIG. 3 is a view that shows a mirror holding point and an exposure light's illuminating area, in a mirror of a first embodiment, according to the present invention.
Figure 3B:
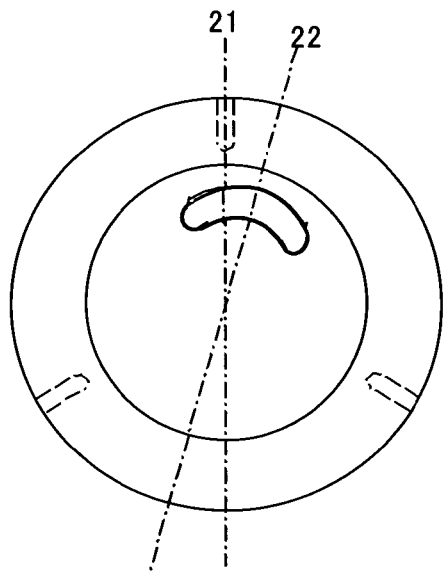

Accordingly, as shown in FIG. 3A, when the illuminating area 20 in exposure light is radii-shape, a holding point is arranged so that the symmetry axis 22 corresponds with the symmetry axis 21 of a holding point in the mirror 10. Thus, the mirror's 10 distortion may be symmetrical and surface deformation, which deteriorates optical performance, is lowered. In the instant embodiment, the symmetry axis 22, in the illuminating area 20 of the exposure light, corresponds absolutely with the symmetry axis 21 of the mirror's 10 holding point. Furthermore, the present invention may achieve the above effect even when an error angle between the symmetry axis 22 of the exposure light's illuminating area 20 and the symmetry axis 21 of a holding point of the mirror 10 is within 10° or less.

With the above method for holding the mirror 10 in a suitable position, the mirror 10 may distort symmetrically and surface deformation, which deteriorates optical performance, is lowered.

Figure 3C:
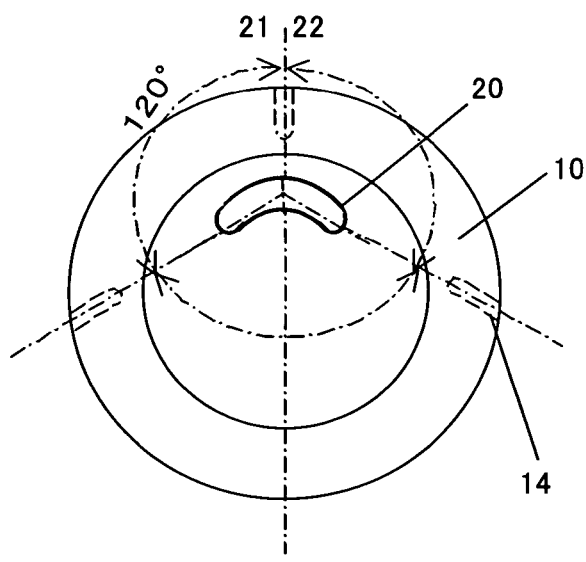

The symmetry axis 22 in the illuminating area 20 of the exposure light corresponds with the symmetry axis 21 in the holding point of the mirror 10. Furthermore, it has three points, on three positions divided at equivalent angles at a center in the mirror 10 shown in FIG. 3A. Thus, as shown in FIG. 3A, the mirror 10 warps the illuminating area to the top, which results in a large thermal expansion at the top. The illumination position of the exposure light in the mirror 10 slowly moves until the exposure light is illuminated and a temperature of the mirror 10 becomes steady. In FIG. 3C, the holding point of the mirror 10 is chosen so that the symmetry axis 22 in the illuminating area of the exposure light corresponds with the symmetry axis 21 in the holding point of the mirror 10. Additionally, it has three points, on three positions divided at equivalent angles at a center in the illuminating area of the exposure light shown in FIG. 3C. Here, the center in the illuminating area of the exposure light means a center point of a long axis and a brachyaxis in a radii-shape. Thus, the displacement in the illuminating exposure light's position on the mirror 10 may become small. The image's focus error may decrease and line width accuracy may increase. In the instant embodiment, a center in the illuminating area 20 of the exposure light corresponds absolutely with that in the mirror holder. Furthermore, a center point error between the illuminating area 20 of the exposure light and the mirror holder may be within 4% of a mirror's diameter.

Figure 4A:
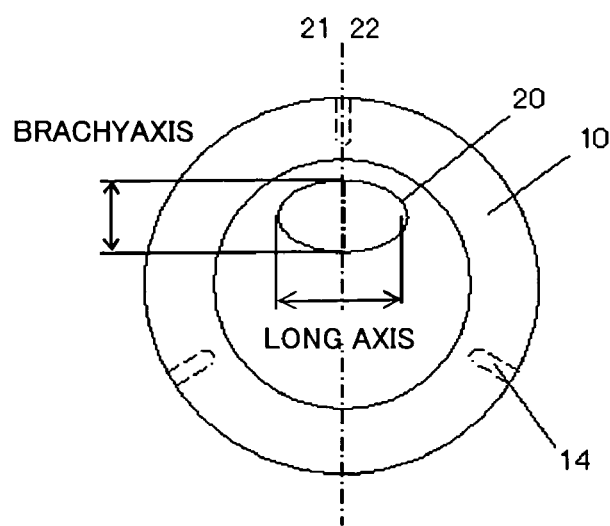
FIG. 4 is a view that shows a mirror holding point and an exposure light's illuminating area, in a mirror of a second embodiment, according to the present invention.

FIG. 4 shows the second embodiment according to the present invention. An illuminating area of exposure light in FIG. 4 is an ellipse. As shown in FIG. 4A, a holder is arranged so that the symmetry axis 22, in the illuminating-area 20, of the exposure light, corresponds with the symmetry axis 21 in the mirror holder. Thus, the mirror 10 may distort symmetrically, and surface deformation, which deteriorates optical performance, is lowered. In the instant embodiment, the symmetry axis 22, of the exposure light's illuminating area 20, corresponds absolutely with the symmetry axis 21 of a mirror's 10 holding point. Furthermore, the present invention may achieve the above effect even when an error angle between the symmetry axis 22, of the exposure light's illuminating area 20 and the symmetry axis 21 of a mirror's 10 holding point is within 10° or less.

Figure 4B:
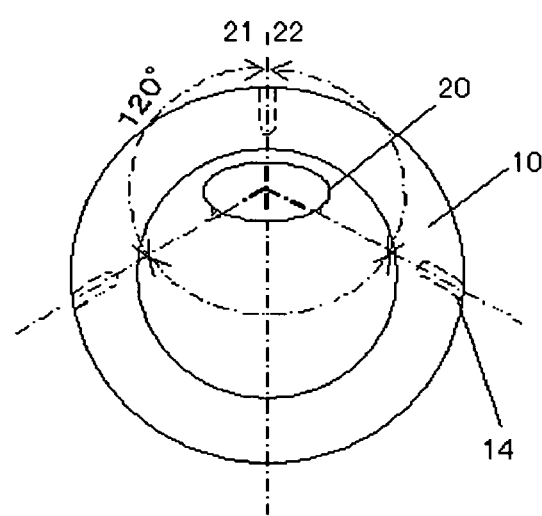

FIG. 4B shows the correspondence of the symmetry axis 22 in the exposure light's illuminating area with the symmetry axis 21 in the mirror holder. It has three points, on three positions divided at equivalent angles at a center in the exposure light's illuminating area 20. (In an ellipse, a center in an illuminating area of exposure light means a center point of a long axis and a brachyaxis.) Thus, the displacement in the illuminating exposure light's position on the mirror 10 may become small. The image's focus error may decrease and line width accuracy may increase. In the instant embodiment, a center in the exposure light's illuminating area 20 corresponds absolutely with that in the mirror holder. Furthermore, a center point error between the exposure light's illuminating area 20 and the mirror holder may be within 4% of a mirror's diameter.

FIG. 5 shows a third embodiment according to the present invention. An exposure light's illuminating area, as shown in FIG. 5, is intermediate shape between a radii and an ellipse. A holding point is arranged so that the symmetry axis 22 of the exposure light's illuminating area 20 corresponds with the symmetry axis 21 in the mirror holder. Thus, the mirror 10 may distort symmetrically, and surface deformation, which deteriorates optical performance, is lowered. In the instant embodiment, the symmetry axis 22 in the exposure light's illuminating area 20 corresponds absolutely with the symmetry axis 21 of a mirror's 10 holding point. Furthermore, the present invention may achieve the above effect even when an error angle between the symmetry axis 22 in the exposure light's illuminating area 20 and the symmetry axis 21 of a mirror's 10 holding point is within 10° or less.

Figures 5A, 5B:
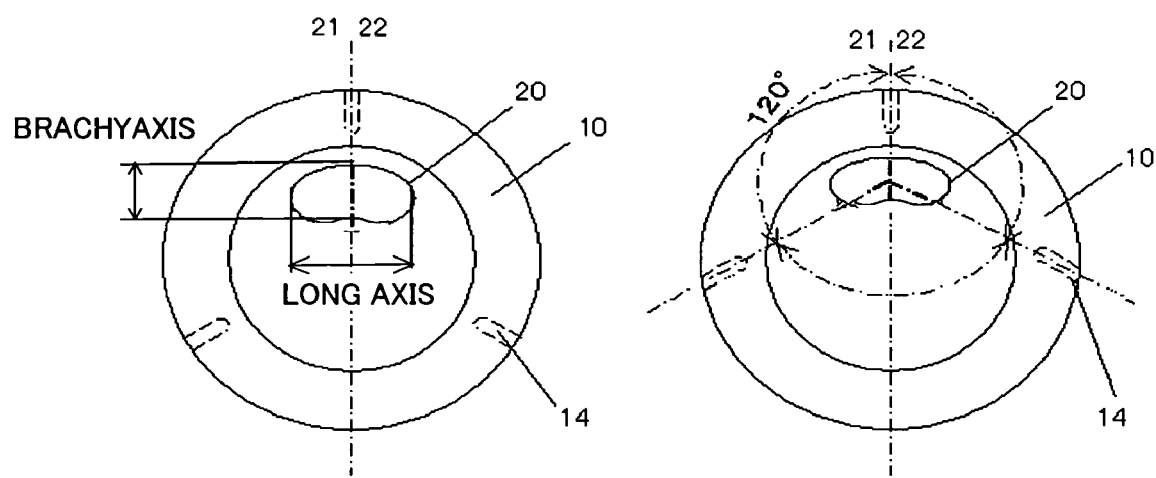
FIG. 5 is a view that shows a mirror holding point and an exposure light's illuminating area, in a mirror of a third embodiment, according to the present invention.

FIG. 5B shows the correspondence of the symmetry axis 22 in the exposure light's illuminating area with the symmetry axis 21 in the mirror holder. It has three points, on three positions divided at equivalent angles at a center in the exposure light's illuminating area 20. (In the intermediate shape between a radii and an ellipse, a center in an exposure light's illuminating area means a center point of a long axis and a brachyaxis) Thus, the displacement in the illuminating exposure light's position on the mirror 10 may become small. The image's focus error may decrease and line width accuracy may increase. In the instant embodiment, a center in the exposure light's illuminating area 20 corresponds absolutely with that in the mirror holder. Furthermore, a center point error between the exposure light's illuminating area 20 and the mirror holder may be within 4% of a mirror's diameter.

Figure 6:
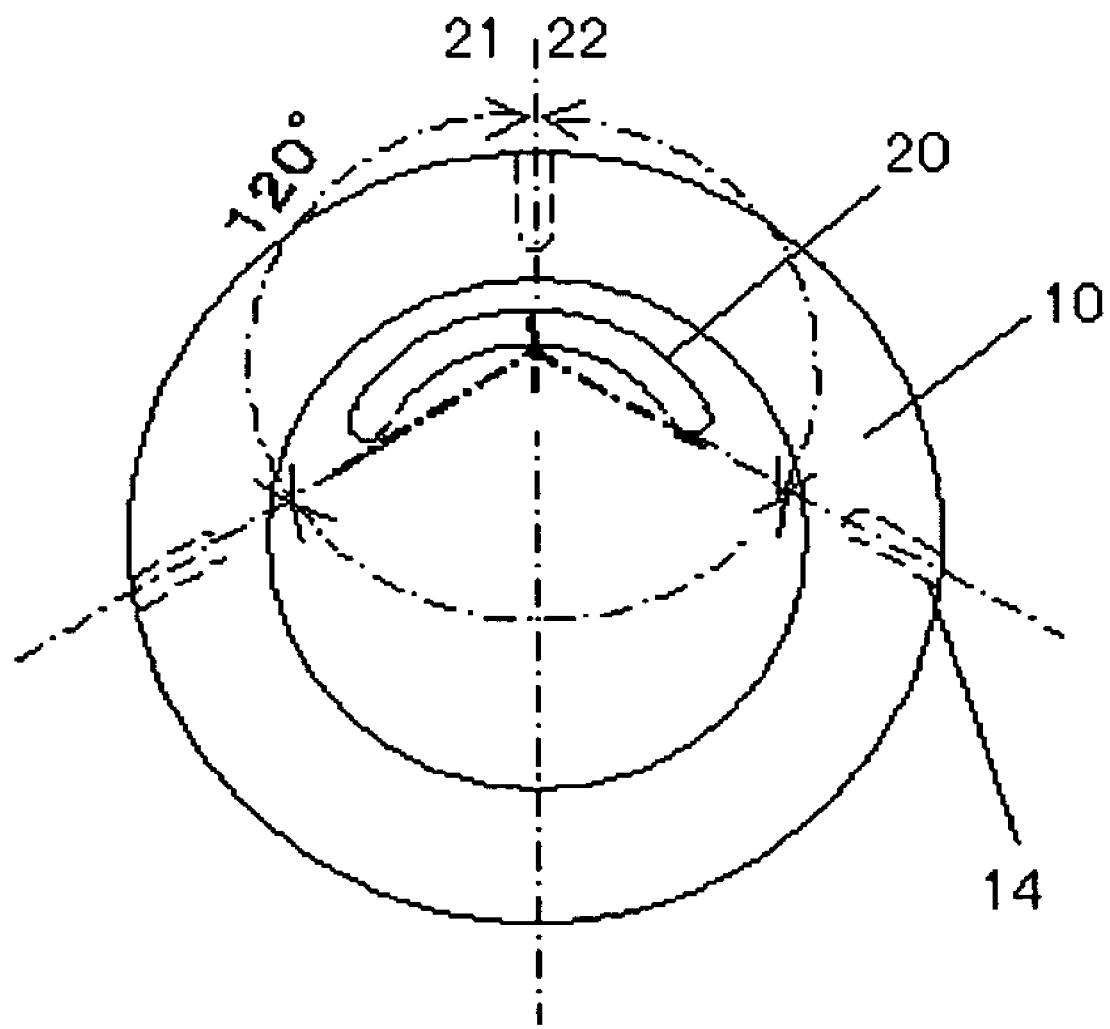
FIG. 6 is a view that shows a mirror holding point and an exposure light's illuminating area, in a mirror of a fourth embodiment, according to the present invention.

FIG. 6 shows a fourth embodiment according to the present invention. An exposure light's illuminating area, as shown in FIG. 6, is intermediate shape between a radii and an ellipse. A center in the exposure light's illuminating area deviates from the exposure light's illuminating area shown in FIG. 6. Thus, the symmetry axis 22 in the exposure light's illuminating area corresponds with the symmetry axis 21 in the mirror holder. It has three points, on three positions divided at a centroid angle of a centroid in the exposure light's illuminating area 20. Thus, the displacement in the illuminating exposure light's position on the mirror 10 may become small. The image's focus error may decrease and line width accuracy may increase. In the instant embodiment, a center in the illuminating area 20 of the exposure light corresponds absolutely with that in the mirror holder. Furthermore, a centroid point error between the illuminating area 20 of the exposure light and the mirror holder may be within 4% of a mirror's diameter.

Next, descriptions will be given of structures for holding a mirror. When the mirror 10, held at each of three points (x, y, and z), thermally expands due to the exposure light, surface deformation increases because thermal stress cannot be relaxed. On the other hand, even if the mirror expands thermally due to temperature elevation, when the mirror 10 is held according to this embodiment at three points using V-shaped groove 14 and the sphere 13 shown in FIG. 2, the mirror is allowed to expand in the radius direction because the sphere 13 moves in the radius direction in the V-shaped groove 14. Since the mirror may have simple expansion, contraction and deformation, it may lower surface deformation, which deteriorates optical performance. The mirror holder is not limited to those of the present embodiment. It is possible to use a holder, which does not cause asymmetry deformation.

When the mirror's deformation results only from curvature deformation, aberration correction may be made by adjusting the interval between each of the mirrors. By using the present invention to inhibit deformation other than curvature deformation, aberration correction is easy.

In the above embodiments, the mirror holding method means a mirror supporting method, a mirror holding (supporting) apparatus, or a mirror holder (supporter).

Figure 7:
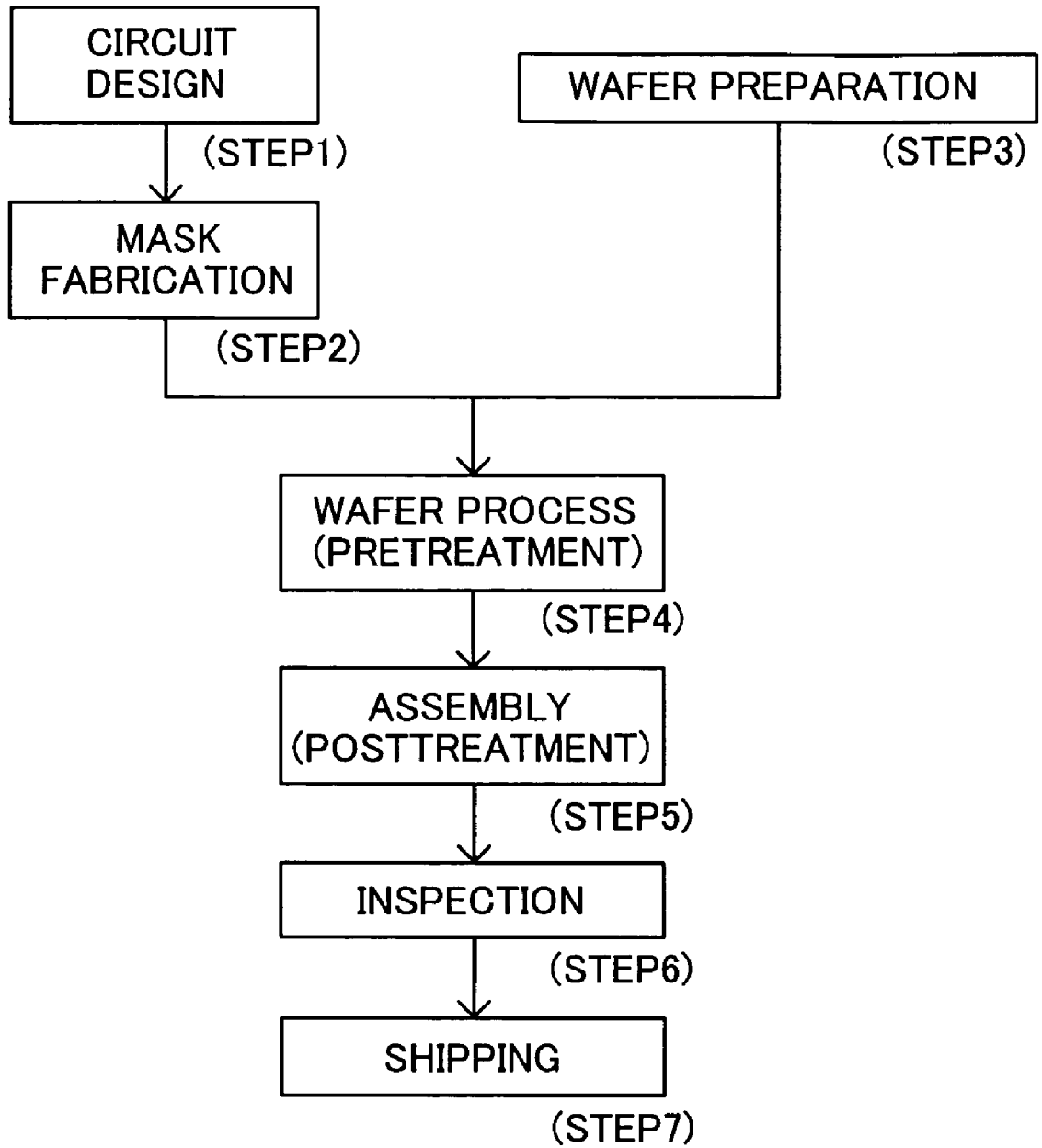
FIG. 7 is a flowchart for explaining how to fabricate devices (such as semiconductor chips such as ICs and LCDs, and the like).
Figure 8:
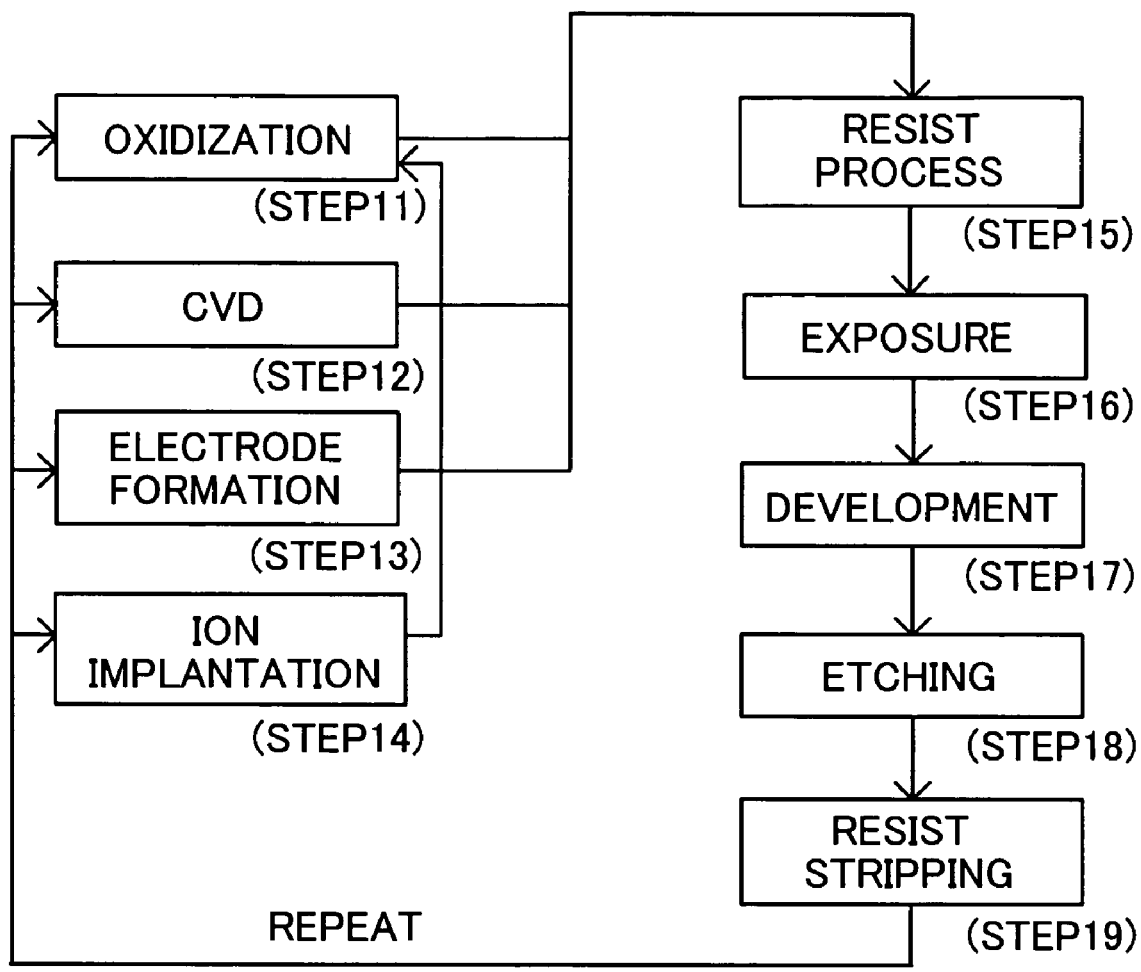
FIG. 8 is a detailed flowchart of a wafer process as shown in Step 4 of FIG. 7.

Referring to FIGS. 7 and 8, a description will be given of an embodiment of a device fabricating method using the exposure apparatus with the above mirror holding (supporting) method. FIG. 7 is a flowchart for explaining device fabrication (i.e., semiconductor chips such as IC and LSI, LCDs, CCDs, etc.). Here, as an example, a description will be given of the fabrication of a semiconductor chip. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), referred to as a pretreatment, using the mask and wafer, forms the actual circuit on the wafer through photolithography. Step 5 (assembly), also referred to as a post-treatment, forms the wafer formed in Step 4 into a semiconductor chip and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 8 is a detailed flowchart of the wafer process in Step 4 in FIG. 7. Step 11 (oxidation) oxidizes the wafer's surface. Step 12 (CVD) forms an insulating film on the wafer's surface. Step 14 (ion implantation) implants ion into the wafer. Step 15 (resist process) applies a photosensitive material onto the wafer. Step 16 (exposure) uses the exposure apparatus 500 to expose a circuit pattern on the mask onto the wafer. Step 17 (development) develops the exposed wafer. Step 18 (etching) etches parts other than a developed resist image. Step 19 (resist stripping) removes unused resist after etching. These steps are repeated to form multilayer circuit patterns on the wafer. The device fabrication method of this embodiment may manufacture a higher quality device than the conventional method. A device fabrication method using the above exposure apparatus and devices as the resultant products would constitute one aspect of the present invention.

Furthermore, the present invention is not limited to these preferred mirror holders in an exposure apparatus, and various variations and modifications may be made without departing from the scope of the present invention. claim 1 according to the present invention can prohibit asymmetry deformation in a mirror's surface when a center in an exposure light's illuminating area in a mirror differs from that in a mirror holding point.

What is claimed is:

1. A mirror holding method for holding a mirror using a mirror holder having a plurality of holding points, the mirror having an optical surface, and only part of the optical surface comprises an illuminating area, said mirror holding method comprising the step of arranging the mirror holder so that a symmetry axis of one of the holding points projected on a plane perpendicular to the optical axis of the mirror is substantially aligned with a symmetry axis of the illuminating area projected on the plane perpendicular to the optical axis of the mirror, wherein a position of a center of the illuminating area that is projected on the plane perpendicular to the optical axis of the mirror differs from a position of a center of the mirror that is projected on the plane perpendicular to the optical axis of the mirror.

2. A mirror holding method according to claim 1, wherein the mirror reflects EUV light.

3. A mirror holding method according to claim 1, wherein the mirror holder comprises three holding points.

4. An optical apparatus according to claim 1, wherein the mirror holder holds, at three points, a weight of the mirror.

5. An optical apparatus comprising:

an optical system that includes a mirror having an optical surface, only part of the optical surface serving as an illuminating area, and a position of a center of the illuminating area that is projected on a plane perpendicular to an optical axis of the optical system differing from a position of a center of the mirror that is projected on the plane, and a mirror holder for holding the mirror, the mirror holder comprising a plurality of holding points, wherein when illuminating area and the mirror holder are projected on a plane perpendicular to an optical axis of the mirror, a holding point of the mirror holder is generally symmetric to a symmetry axis of the illuminating area that is projected on the plane.

6. An optical apparatus according to claim 5, wherein the mirror reflects EUV light.

7. An exposure apparatus comprising an optical apparatus according to claim 5.

8. A device fabricating method comprising the steps of:
exposing an object by an exposure apparatus that includes an optical apparatus according to claim 5; and
developing the exposed object.

* * * * *